(12) United States Patent
Morancho et al.

(10) Patent No.: US 10,177,239 B2
(45) Date of Patent: Jan. 8, 2019

(54) HEMT TRANSISTOR

(71) Applicants: CENTRE NATIONAL DE LA RECHERCHE SCIENTIFIQUE—CNRS-, Paris (FR); UNIVERSITE LIBANAISE, Beirut (LB)

(72) Inventors: Frédéric Morancho, Ramonville-saint-agne (FR); Saleem Hamady, Toulouse (FR); Bilal Beydoun, Beirut (LB)

(73) Assignees: CENTRE NATIONAL DE LA RECHERCHE SCIENTIFIQUE, Paris (FR); UNIVERSITE LIBANAISE, Beyrouth (LB)

( * ) Notice: Subject to any disclaimer, the term of this patent is extended or adjusted under 35 U.S.C. 154(b) by 0 days.

(21) Appl. No.: 15/535,933

(22) PCT Filed: Dec. 15, 2015

(86) PCT No.: PCT/FR2015/053503
§ 371 (c)(1),
(2) Date: Sep. 6, 2017

(87) PCT Pub. No.: WO2016/097576
PCT Pub. Date: Jun. 23, 2016

(65) Prior Publication Data
US 2018/0069090 A1    Mar. 8, 2018

(30) Foreign Application Priority Data
Dec. 15, 2014 (FR) ..................... 14 62461

(51) Int. Cl.
*H01L 29/66* (2006.01)
*H01L 29/10* (2006.01)
(Continued)

(52) U.S. Cl.
CPC .... *H01L 29/66462* (2013.01); *H01L 29/1054* (2013.01); *H01L 29/1075* (2013.01);
(Continued)

(58) Field of Classification Search
CPC ......... H01L 29/66431; H01L 29/66462; H01L 29/778; H01L 29/7787; H01L 29/1054; H01L 29/1083
See application file for complete search history.

(56) References Cited

U.S. PATENT DOCUMENTS

2007/0278518 A1    12/2007  Chen et al.
2012/0019284 A1*   1/2012   Mauder ................. H01L 29/402
                                                                326/49

(Continued)

FOREIGN PATENT DOCUMENTS

| EP | 1884999 A1 | 2/2008 |
| EP | 2346071 A1 | 7/2011 |
| FR | 3011981 A1 | 4/2015 |

OTHER PUBLICATIONS

Bong-Hwan, K., Seoung-Hwan, P., Jung-Hee, L., & Yong-Tae, M. (2010). Effect of in Composition on Two-Dimensional Electron Gas in Wurtzite AlGaN/InGaN Heterostructures. Chinese Physics Letters, 27(11), 118501. doi:10.1088/0256-307X/27/11/118501.

(Continued)

*Primary Examiner* — David Spalla
(74) *Attorney, Agent, or Firm* — Volpe and Koenig, P.C.

(57) ABSTRACT

Heterojunction structure, also referred to as a heterostructure, of semiconductor material, in particular for a high electron mobility transistor (HEMT), includes a substrate, a stack of at least three buffer layers of a same semiconductor material with a wide bandgap EG1 based on a column-III nitride, namely an unintentionally doped first buffer layer, a second buffer layer, an unintentionally doped third buffer layer, an unintentionally doped intermediate layer, and a (Continued)

barrier layer arranged on the intermediate layer, said barrier layer being of a semiconductor material with a wide bandgap EG2 based on a column-III nitride; the second buffer layer has constant P+ doping throughout some or all of its thickness; and the third buffer layer includes a first region which is unintentionally doped throughout its entire thickness and at least one second region adjacent to said first region with N+ doping surrounding the first region.

15 Claims, 9 Drawing Sheets

(51) Int. Cl.
*H01L 29/778* (2006.01)
*H01L 29/20* (2006.01)

(52) U.S. Cl.
CPC ........ *H01L 29/1083* (2013.01); *H01L 29/778* (2013.01); *H01L 29/7786* (2013.01); *H01L 29/2003* (2013.01)

(56) References Cited

U.S. PATENT DOCUMENTS

| | | | |
|---|---|---|---|
| 2013/0062666 A1* | 3/2013 | Imada | H01L 29/66212 257/194 |
| 2013/0256547 A1 | 10/2013 | Kamada | |
| 2013/0256685 A1* | 10/2013 | Ohki | H01L 29/778 257/76 |
| 2013/0256754 A1* | 10/2013 | Kamada | H01L 29/36 257/194 |
| 2014/0091316 A1* | 4/2014 | Kikkawa | H01L 29/66462 257/76 |
| 2016/0025437 A1 | 9/2016 | Morancho et al. | |
| 2016/0254377 A1 | 9/2016 | Morancho et al. | |

OTHER PUBLICATIONS

Burnham S. D., Boutros K., Hashimoto P., Butler C., Wong D. W. S., Hu M., Micovic M.: Gate-recessed normally-off GaN-on- Si HEMT using a new O2-BCl3 digital etching technique, Physica Status Solidi, vol. 7 No. 7-8 doi:10.1002/pssc.200983644.

Chen, H., Wang M., Chen, K. J.: Self-aligned Enhancement-mode AlGaN/GaN HEMTs Using 25 keV Fluorine Ion Implantation, Device Research Conference (DRC) 2010, vol. 4 No. 852 pp. 137-138.

Chonan, H., et al. (2012). Effect of hole injection in AlGaN/GaN HEMT with GIT structure by numerical simulation. Physica Status Solidi (C), 9(3-4), 847-850. doi:10.1002/pssc.201100330.

Higashiwaki, M., Mimura, T., Matsui, T., & E-mode, A. H. (2007). Enhancement-Mode AlN / GaN HFETs using CAT-CVD SiN, 54(6), 1566-1570.

Hu X., Simin G., Yang J., Khan M., Gaska R., Shur M.: Enhancement Mode AlGaN/GaN HFET with Selectively Grown on Junction Gate, Electronics Letters 2000, vol. 36 No. 8 pp. 753-754.

Mishra, U. K., & Parikh, P. (2002). AlGaN/GaN HEMTs—an overview of device operation and applications. Proceedings of the IEEE, 90(6), 1022-1031. doi:10.1109/JPROC.2002.1021567.

Mizutani T., Ito M., Kishimoto S., Nakamura F.: AlGaN/GaN HEMTs With Thin InGaN Cap Layer for Normally Off Operation, IEEE Electron Device Letters 2007, vol. 28 No. 7 pp. 549-551.

Morita T., Yanagihara M., Ishida H., Hikita M., Kaibara K., Matsuo H., Uemoto Y., Ueda T., Tanaka T., Ueda D., 650 V 3.1 mΩcm2 GaN-based monolithic bidirectional switch using normally-off gate injection transistor, IEEE International Electron Devices Meeting (IEDM) pp. 865-868, 2007.

Ohmaki, Y., Tanimoto, M., Akamatsu, S., & Mukai, T. (2006). Enhancement-Mode AlGaN/AlN/GaN High Electron Mobility Transistor with Low On-State Resistance and High Breakdown Voltage. Japanese Journal of Applied Physics, 45(No. 44), L1168-L1170. doi:10.1143/JJAP.45.L1168.

H. Kambayashi, Y. Satoh, S. Ootomo, T. Kokawa, T. Nomura, S. Kato, T.P. Chow, Over 100 A operation normally-off AlGaN/GaN hybrid MOS-HFET on Si substrate with high-breakdown voltage, Solid-State Electronics, vol. 54, Issue 6, Jun. 2010, pp. 660-664.

Kambayashi, H., Satoh, Y., Kokawa, T., Ikeda, N., Nomura, T., & Kato, S. (2010). Solid-State Electronics High field-effect mobility normally-off AlGaN / GaN hybrid MOS-HFET on Si substrate by selective area growth technique. Solid State Electronics, 1-5. doi:10.1016/j.sse.2010.10.001.

Xu, F., et al. (2008). Enhanced device performance of AlGaN / GaN HEMTs using thermal oxidation of electron-beam deposited Aluminum for gate oxide, 2-5.

* cited by examiner

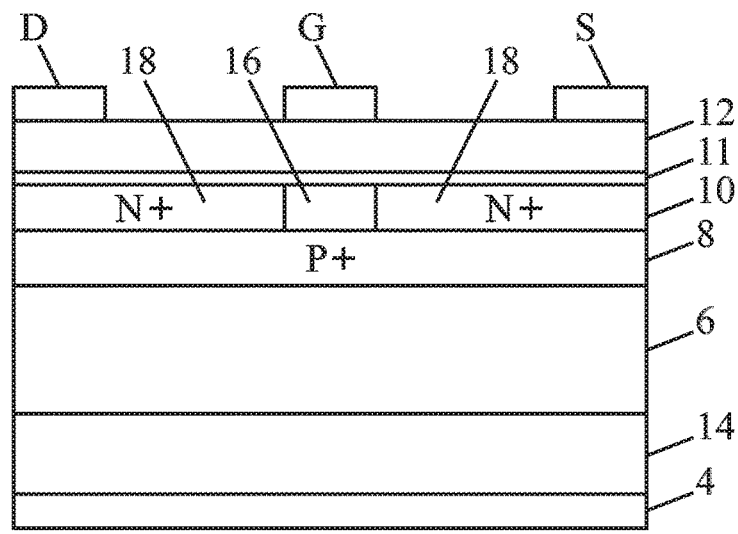
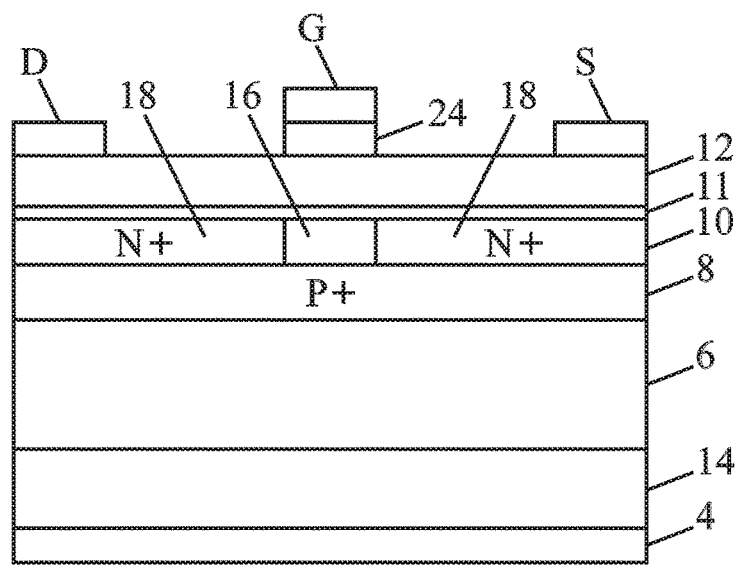

HEMT TRANSISTOR

TECHNICAL FIELD

The present invention relates in general to techniques for implementing high electron mobility transistors (HEMT transistor). It relates more particularly to a heterostructure from which such a transistor can be implemented.

The invention finds particular applications in particular in the field of power electronics used, for example, in devices for producing, converting, and/or managing renewable energies such as wind or solar energy, but also in transport with low ecological impact.

BACKGROUND

Renewable energy sources such as wind or solar energy for example have become viable alternatives in recent years, appropriate for addressing global warming and the depletion of fossil fuel resources. In addition, the development of transportation with low environmental impact, such as the electric tram, train, or car, relies on the development of suitable power electronics, and more specifically power switches.

In particular, improvements to semiconductor components in the form of integrated circuits, for example such as power transistors, concern the intrinsic properties of these components for increasing their operating voltage and/or their maximum switching frequency. They also aim to provide solutions for total integration enabling mass production, in order to reduce production costs.

At this time, only power components based on silicon (Si) fulfill such functions, for example such as MOS ("Metal Oxide Semiconductor") or IGBT ("Insulated Gate Bipolar Transistor") transistors. However, the physical properties inherent to the use of Si make technological advancements difficult in such components.

In recent years, numerous research projects have led to finding alternative solutions with the use of wide-bandgap materials, enabling the implementation of new power components such as high electron mobility transistors, also called HEMT transistors.

Silicon carbide (SiC) and gallium nitride (GaN) have emerged as two of the most promising materials due to their high critical electric field and a wide range of operating temperatures. Despite remarkable results, however, power components based on SiC have difficulties penetrating mass markets due to the limited size of SiC wafers (maximum diameter of 100 mm to 150 mm at present). In addition, problems remain for this type of component, concerning the management of defects as well as the reproducibility of the manufacturing methods.

GaN seems to be a very attractive alternative to SiC for the design of the power components. GaN is a more effective semiconductor material than Si or SiC in terms of compromise between on-resistance/breakdown voltage. This ratio, also known as figure-of-merit, characterizes the static performance of a power switch.

FIG. 1 shows an exemplary electronic heterojunction structure used in an HEMT transistor. This electronic heterojunction structure comprises several layers based on GaN, each having controlled intrinsic properties and stacked one above the other, with:

a substrate 1, above which lies a first layer 3, called the buffer layer, composed of a material M1 characterized by its bandgap or gap $Eg1$; and, a second layer 5, called the barrier layer, above the first layer 3 and composed of a material M2 characterized by its bandgap or gap $Eg2$, where $Eg1$ is less than $Eg2$.

Many research projects focus on the management and improvement of two-dimensional electron gas confinement at the AlGaN/GaN heterostructure, investigating various solutions. These solutions may involve deposition of the GaN layer so as to modify certain intrinsic properties of the heterostructure, thereby obtaining HEMT transistors with relatively high switching speeds and relatively low losses. They may also consist of creating new MOS-HEMT type structures.

Thus, for example, a MOS-HEMT transistor structure is proposed in the 2008 IEEE publication: "Enhanced device performance of AlGaN/GaN HEMTs using thermal oxidation of electron-beam deposited aluminum for gate oxide" by C. Hongwei et al. This publication shows the improvement in the performance of a conventional HEMT transistor structure which can be obtained by adding an oxidation layer at the gate electrode. The resulting MOS-HEMT structure has smaller leakage currents and a greater range of drain currents than a conventional HEMT structure, although a threshold voltage of less than zero volts is required to place the transistor in an off state.

Yet another area of very significant research currently concerns the resting state of this type of structure, meaning the state of the transistor when no voltage is applied to the gate electrode of the HEMT transistor. In fact, in many power applications, the transistor used as a switch must be in the open state by default (also called the "normally OFF" functionality). This state is essential for safety reasons and to save energy, for example in automotive or railway applications.

Several GaN-based structures have recently been proposed to offer the "normally OFF" functionality of an HEMT transistor. Work by the team of C. Hongwei et al has demonstrated the possibility of modifying the threshold voltage to obtain a "normally OFF" HEMT transistor by using treatment with fluorine ions, in a publication called "Self-aligned enhancement-mode AlGaN/GaN HEMTs Using 25 keV Fluorine Ion Implantation" published in 2010 in the IEEE journal. To do this, a fluorine-doped area is inserted into the barrier layer of the AlGaN/GaN structure of the HEMT transistor and this is placed below the gate electrode, the doses of fluorine ion being predefined so as to have a sufficient difference in the voltage Vgs of the transistor.

US patent application 2007/0278518 entitled "Enhancement Mode III-N Devices and Circuits" proposes another enhancement to the manufacturing method for an HEMT transistor structure. According to this enhancement, a method of treating the barrier layer of the heterostructure by a fluorine plasma is used. By a relatively simple process (using a fluorine plasma), this method modifies the intrinsic properties of the heterostructure in order to obtain a "normally OFF" transistor.

Advancements in design and manufacturing techniques such as those presented above allow obtaining "normally OFF" HEMT transistors which can only address certain energy conversion markets, due to the still relatively high leakage currents.

US patent application 2013/0256685 entitled "Compound semiconductor device and method for manufacturing the same" proposes an HEMT-based structure in which a two-dimensional electron gas is generated, and an electrode is formed on the HEMT-based structure. The structure further comprises a P-type semiconductor layer below a region where the two-dimensional electron gas is generated. To control the electron density of the two-dimensional gas, the P-type semiconductor layer includes a portion containing a larger amount of ionized acceptors than other portions of the P-type semiconductor layer.

SUMMARY

The invention aims to overcome the disadvantages of the prior art cited above, and more specifically to enable the implementation of an HEMT transistor with a low leakage current at the gate, a high switching speed, and a threshold voltage greater than 0 V in order to provide the "normally OFF" functionality.

To this end, a first aspect of the invention provides a heterojunction structure, in particular for a high electron mobility transistor (HEMT), comprising:

a planar substrate, a stack of buffer layers with at least three layers of a same semiconductor material with a wide bandgap Eg1 based on a column-III nitride, including:

an unintentionally doped first buffer layer arranged on the substrate, a second buffer layer arranged on the first layer and having a predefined thickness in a direction orthogonal to the substrate plane, an unintentionally doped third buffer layer arranged on the second buffer layer and having a predefined thickness in a direction orthogonal to the substrate plane, an unintentionally doped intermediate layer arranged on the third buffer layer, of a semiconductor material with a wide bandgap Eg1 based on a column-III nitride identical to that of the stack of buffer layers, a barrier layer arranged on the intermediate layer, said barrier layer being of a semiconductor material with a wide bandgap Eg2 based on a column-III nitride, wherein:

the second buffer layer has substantially constant P+ doping throughout some or all of its thickness, and the third buffer layer comprises a first region which is unintentionally doped throughout its entire thickness and at least one second region adjacent to said first region and which is doped with N+ doping. Thus, due to the presence of the two regions, the effect of the P+ doped second buffer layer on a two-dimensional electron gas is attenuated.

In an exemplary embodiment, the second region adjacent to the first region of the third buffer layer has constant doping throughout the entire thickness of said third buffer layer, thereby controlling the formation of the two-dimensional gas 2DEG.

Alternatively, the second region adjacent to the first region of the third buffer layer has Gaussian-shaped doping along the thickness of said third buffer layer.

According to some embodiments of the invention, a distance in a direction orthogonal to the substrate plane, between the second buffer layer and the interface between the intermediate layer and the barrier layer, is less than 20 nm, which allows controlling and locally raising the Fermi level and the conduction band of the heterojunction.

In various embodiments of the invention, the semiconductor material based on a column-III nitride of which are made the first buffer layer, the second buffer layer, the third buffer layer, the layer arranged on the third buffer layer, and the barrier layer, comprises GaN.

N+ doping may be used to dope the region adjacent to the first region of said third buffer layer, and the dopant is preferably silicon.

Advantageously, to remedy this problem as well as potential problems of dislocation, in one embodiment of the invention a transition layer is interposed between the substrate and the first buffer layer.

A second aspect of the invention relates to an HEMT transistor implemented from a heterostructure as described above. The transistor comprises a gate electrode of a predefined surface area in a first plane parallel to the substrate plane, and a drain electrode and source electrode both arranged in a second plane above the barrier layer of the heterojunction structure. The first and second planes may be coincident or offset.

In an exemplary embodiment, the first region of the third buffer layer of the heterojunction structure is arranged under the gate electrode, and has a surface area in a plane parallel to the substrate plane which is less than or equal to said surface area of the gate electrode.

In some embodiments, such a transistor may comprise an oxide-based insulating layer, on the barrier layer, below the gate electrode, in order to control leakage currents.

For example, the insulating layer has a surface area in a plane parallel to the substrate plane that is identical to the surface area of the gate electrode.

According to a third aspect of the invention, a semiconductor product comprising at least one transistor according to the second aspect is provided. This can be, for example, a power switch or any other power component such as a power voltage regulator for example.

According to a fourth aspect, the invention relates to a method for manufacturing such a heterostructure which comprises:

preparing a planar substrate, successively depositing on the substrate a stack of buffer layers made of a same semiconductor material with a wide bandgap Eg1 based on a column-III nitride, including:

depositing a first buffer layer on the substrate, said semiconductor material of which said first buffer layer is made being unintentionally doped, depositing a second buffer layer on the first buffer layer, having a predefined thickness in a direction orthogonal to the substrate plane and the doping of said second buffer layer being done with P+ dopants throughout its entire thickness;

depositing a third buffer layer on the second buffer layer, having a predefined thickness in a direction orthogonal to the substrate plane, said semiconductor material of which said third buffer layer is made being unintentionally doped, doping, using N+ dopants, at least one region of the third buffer layer adjacent to a first region of said third buffer layer which is unintentionally doped throughout its entire thickness, depositing an unintentionally doped intermediate layer of a semiconductor material with a wide bandgap Eg1 based on a column-III nitride identical to that of the stack of buffer layers, depositing a barrier layer of a semiconductor material with a wide bandgap based on a column-III nitride, on the third buffer layer.

Note that preferably the intermediate layer and the barrier layer cover the entirety of the buffer layers, and therefore the electrodes of the transistor mounted thereon will not be in direct contact with the P+ doped layer.

Advantageously, this manufacturing method is simple and requires few additional steps in comparison to the manufacturing of a conventional heterostructure, for example for the implementation of a conventional HEMT transistor.

For optimized performance of the structure, an alternative embodiment of the method proposes that the successive depositions of the stack of layers are carried out without interrupting an epitaxy process.

BRIEF DESCRIPTION OF THE DRAWINGS

Other features and advantages of the invention will become apparent from reading the following description. This is purely illustrative and is to be read with reference to the accompanying drawings, in which:

FIG. 15 is a section view of an HEMT transistor according to one embodiment;

FIG. 20 is a section view of an exemplary HEMT transistor according to another embodiment.

DETAILED DESCRIPTION OF THE PREFERRED EMBODIMENTS

It should first be noted that all figures showing section views of the heterojunction structure and all figures showing stacks of layers as well as those representing steps in the manufacturing process for the heterojunction structure and the HEMT transistor are not to scale. The various thicknesses are not represented in their actual proportions. For simplification of the following description and the figures, elements common to all structures have the same references.

The invention will be specifically described in a non-limiting example of an application to a heterojunction structure 2 for HEMT transistors. The exemplary heterojunction structure 2 described below is based on nitrides in column III of the periodic table of the elements, also called Mendeleev's table. It relates more particularly to a heterojunction structure 2 based on nitride materials forming an AlGaN/GaN interface. Advantageously, the GaN is a semiconductor material with a smaller bandgap Eg1 than the bandgap Eg2 of the AlGaN material.

It is obvious, however, that the invention is not limited to these examples. For example, a heterojunction structure that makes use of the properties of another type of semiconductor material enabling the creation of an interface between a wide bandgap material such as GaAlAs and a small bandgap material such as GaAs can be implemented.

Figure 1:
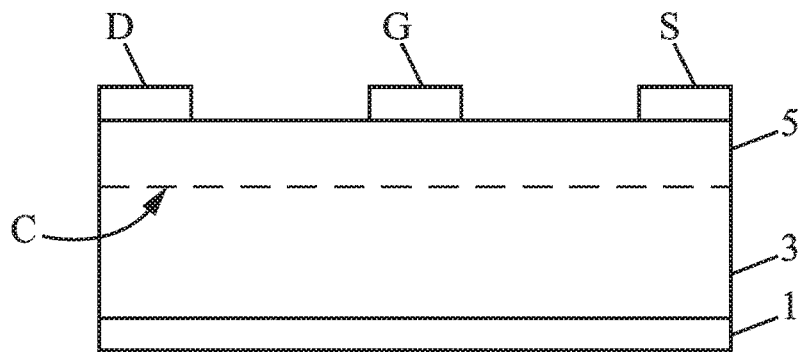
FIG. 1, already discussed, is a section view of a heterojunction structure according to the prior art.
Figure 2:
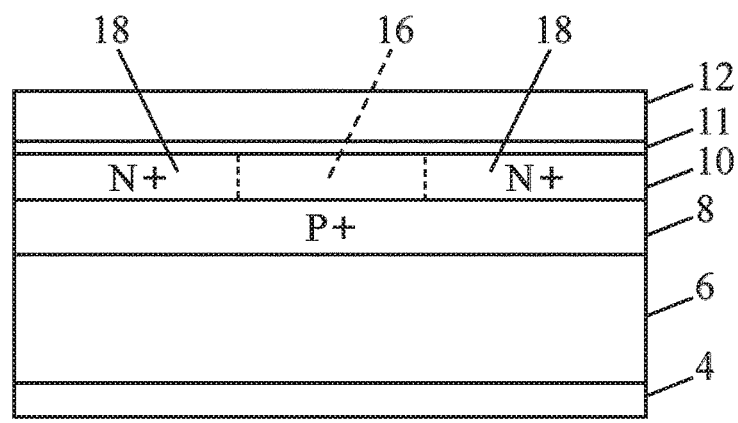
FIG. 2 is a section view of an exemplary stack of layers forming a heterojunction structure according to one embodiment of the invention.

FIG. 2 shows a first example of a stack of buffer layers constituting the heterojunction structure 2. It comprises, in ascending order in the stack:

a planar substrate 4, a stack of buffer layers with at least three layers of a same semiconductor material with a wide bandgap Eg1 based on a column-III nitride, including:

an unintentionally doped first buffer layer 6 arranged on the substrate 4, a second buffer layer 8 arranged on the first layer 6 and having a predefined thickness in a direction orthogonal to the substrate plane, an unintentionally doped third buffer layer 10 arranged on the second buffer layer 8 and having a predefined thickness in a direction orthogonal to the substrate plane, an unintentionally doped intermediate layer 11 arranged on the third buffer layer 10, of a semiconductor material with a wide bandgap Eg1 based on a column-III nitride identical to that of the stack of buffer layers, a barrier layer 12 arranged on the intermediate layer 11, said barrier layer 12 being of a semiconductor material with a wide bandgap Eg2 based on a column-III nitride, wherein:

the second buffer layer 8 has substantially constant P+ doping throughout some or all of its thickness, and the third buffer layer 10 includes a first region 16 which is unintentionally doped throughout its entire thickness and at least one second region 18 adjacent to said first region 16 and which is doped with N+ doping.

Note that the buffer layers 6, 8, 10, the intermediate layer 11, and the barrier layer 12 extend in a continuous stack over the entire surface of the structure: the second 8 completely and continuously covering the first 6, the third 10 completely and continuously covering the second 8, the intermediate layer 11 completely and continuously covering the third 10, the barrier layer 12 completely and continuously covering the intermediate layer 11.

The P+ doping mentioned here corresponds to a density between 1017 and 1018 cm-3, preferably between 1018 and 1019 cm-3.

In one exemplary embodiment of such a heterostructure, the manufacturing method comprises:

preparing a planar substrate 4, successively depositing on the substrate 4 a stack of buffer layers made of a same semiconductor material with a wide bandgap Eg1 based on a column-III nitride, including:

depositing a first buffer layer 6 on the substrate 4, said semiconductor material of which said first buffer layer is made being unintentionally doped, depositing a second buffer layer 8 on the first buffer layer 6, having a predefined thickness in a direction orthogonal to the substrate plane and the doping of said second buffer layer being done using P+ dopants throughout its entire thickness, depositing a third buffer layer 10 on the second buffer layer 8, having a predefined thickness in a direction orthogonal to the substrate plane, said semiconductor material of which said third buffer layer is made being unintentionally doped, doping, using N+ dopants, at least one region 18 of the third buffer layer 10 adjacent to a first region 16 of the third buffer layer which is unintentionally doped, throughout its entire thickness, depositing an unintentionally doped intermediate layer 11 of a semiconductor material with a wide bandgap Eg1 based on a column-III nitride identical to that of the stack of buffer layers, depositing a barrier layer 12 of a semiconductor material with a wide bandgap based on a column-III nitride, on layer 11.

The performance of the heterojunction structure 2 having a stack of layers depends among other things on the crystalline quality of the epitaxial material used.

GaN is an epitaxial material which serves to limit partial lattice mismatches with the materials forming the heterostructure. To achieve this, the GaN is obtained by crystal growth from the substrate 4.

Several types of materials can be used to create the substrate 4 as an epitaxial growth substrate for the GaN. In some embodiments, for example, silicon carbide (SiC) is used which gives a lattice mismatch of only about 3.4%, or sapphire (Al2O3). Other exemplary substrates can also be used, for example substrates based on GaAs, ZnO, or "free standing" substrates.

Alternatively, silicon (Si) can also be used. Si is a material commonly used in the manufacturing of electronic components in general and HEMT transistors in particular. Because of the widespread and longstanding use of Si in electronic components, it is a material whose intrinsic properties are very well managed at a very low production cost despite a lattice mismatch that is greater than SiC.

Depending on the nature of the substrate, for example SiC or Si, or the crystal orientation of the Si substrate, the quality of the GaN layer obtained by epitaxial growth can vary, which can affect the performance of the heterojunction structure 2. This is why, in one exemplary embodiment, the heterojunction structure 2 can be created on a Si substrate of predefined crystal orientation, for example the orientation denoted (111) in the literature.

Figure 3:
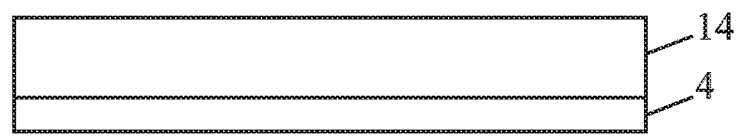
FIGS. 3 to 14 are section views illustrating the main technological steps in creating the heterojunction structure of FIG. 2.

It may sometimes be necessary to deposit a transition layer 14 as shown in FIG. 3, more commonly called a nucleation layer, to remedy potential mismatch problems. This transition layer 14 can also reduce the risk of tearing between layers. Such tears are usually due to the difference in internal mechanical stresses at the interface between the layers. For example and as illustrated in FIG. 3, the transition layer 14 may be arranged between the substrate 4 and the first buffer layer 6 in the stack of buffer layers.

In a variant (not shown in the figures), a plurality of transition layers may be deposited between two layers.

In the case of multiple nucleation layers (or transition layers), they may be deposited, for example in successive deposition operations, on another layer of nitride compounds grown by epitaxy. Advantageously, this improves and/or controls the quality of the first buffer layer 6 so as to avoid for example tearing or the creation of gaps that could cause uncontrolled leakage currents.

Note also that the Si substrate can have another crystal orientation such as (001) or (100), and that intermediate layers can be used if necessary, as previously discussed, in order to obtain a GaN film in accordance with the specifications of the application. It should be noted that the substrates described above are cited herein solely as examples and are in no way limiting to the invention.

The growth of the different layers of the heterojunction structure 2 can be achieved using microelectronics techniques, such as vapor phase epitaxy in HVPE-type reactors using gas mixtures such as GaCl3/NH3. Due to the high growth rates, this technique allows obtaining relatively large thicknesses and excellent qualities.

Other deposition techniques can also be used, for example such as the MBE ("Molecular Beam Epitaxy") method and the MOCVD ("MetalOrganic Chemical Vapor Deposition") method. These methods are cited as examples and are in no way limiting to the techniques for creating such nitride layers usable in the design of HEMT transistors.

Figure 4:
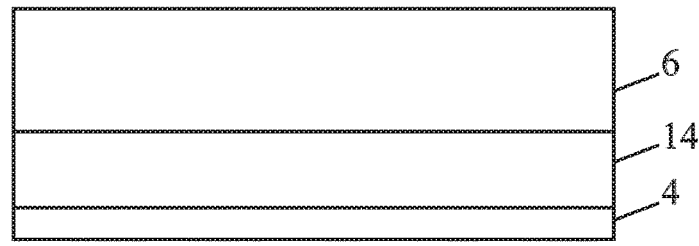

In some embodiments and as shown in FIG. 4, the growth of the first buffer layer 6 in the stack of layers can be obtained by the MOCVD method, for example using elements from column III, in particular by passage through a reaction chamber. For example, this can involve a mixture of molecular hydrogen and a chemical precursor. GaN is thus formed on the surface of the transition layer 14, forming the first buffer layer 6.

Advantageously, the first buffer layer 6 is unintentionally doped. For the skilled person, such a layer unintentionally doped with GaN is also called UID-GaN ("Unintentionally Doped GaN"), GaN-NID ("GaN Non-Intentionally Doped"), or i-GaN ("intrinsic GaN"). Such an epitaxy process allows a growth rate of several μm/h. It is thus possible to obtain a thickness of about 1 to 3 μm for the first buffer layer 6 in only a few hours.

Figure 5:
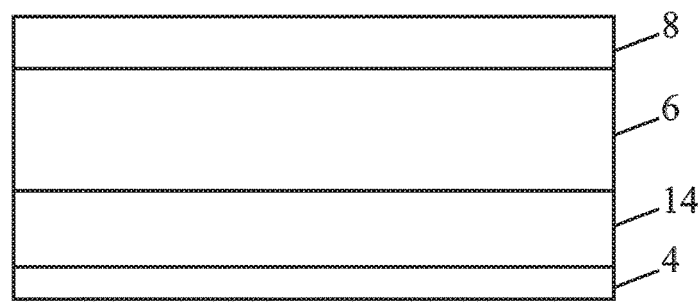

The second buffer layer 8 (FIG. 5) is then deposited on the first buffer layer 6. Advantageously, the second buffer layer 8 is created without interrupting the epitaxy process, meaning without the substrate 4 being removed from the epitaxy chamber or undergoing other technological steps. The quality of the interfaces between the various layers is thus significantly improved. In addition, due to the successive deposition of the stack of layers, the process time is reduced, significantly dropping production costs for the heterojunction structure 2.

The process of growing the second buffer layer 8 by epitaxy is substantially based on the same method as described in the preceding paragraphs for the first buffer layer 6. In order to dope the second buffer layer 8, a P-type dopant is used during the process of growing the layer. The P-type dopant is preferably one of the elements of column II-A, such as magnesium (Mg) for example. However, other dopants in the same column of Mendeleev's periodic table may also be used, such as beryllium for example.

Advantageously, the doses of dopants during the growth process of the second buffer layer 8 can be adjusted to obtain a layer with a predefined doping corresponding to precise specifications for the application.

The second buffer layer 8 has a minimum thickness of 400 nm in order to obtain threshold voltages shifted to positive values.

Figure 6:
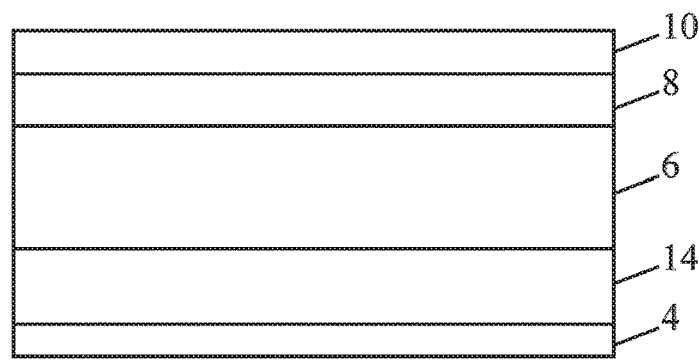

In some embodiments, the heterojunction structure 2 further comprises a third buffer layer 10 of GaN as shown in FIG. 6. The material of this third buffer layer 10 and the intrinsic properties are preferably identical to the properties of the first layer buffer 6 in the stack of layers. Preferably, the third buffer layer 10 is unintentionally doped UID-GaN. The method to obtain this layer is identical to the method presented above for producing the first buffer layer 6. The third buffer layer 10 has a thickness of about 10 nm, which allows shifting the threshold voltage of the HEMT to positive values.

Advantageously, due to the manufacturing method set forth above, the heterojunction structure 2 has a lower risk of tearing the films composing the various layers. In addition, due to the successive deposition of the stack of layers, it is possible to control the amount of impurities in the various layers while reducing the number of technological steps. The cost of manufacturing such a heterojunction structure 2 is thus substantially decreased compared to structures of the prior art.

Figure 7:
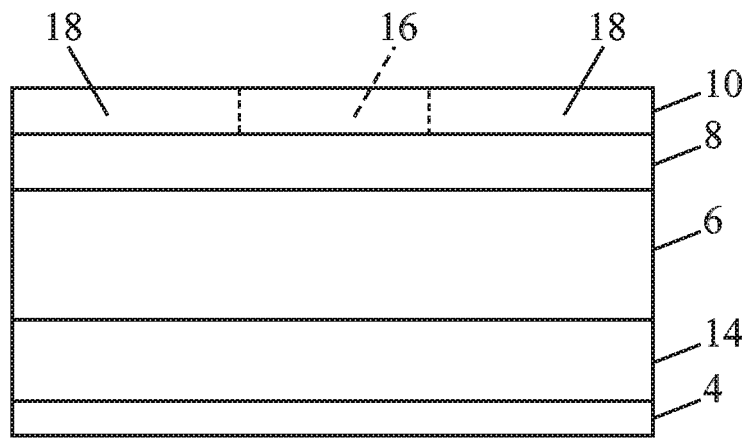

In order to control the carrier density in the two-dimensional electron gas, in a preferred embodiment, a first region 16 and at least one region adjacent to that region 16, such as the adjacent regions 18 located on either side of region 16 in the layered view of FIG. 7, are defined in the third buffer layer 10. Note that when viewed from above, the two regions 18 of FIG. 7 may be a single region 18 surrounding region 16.

Figure 8:
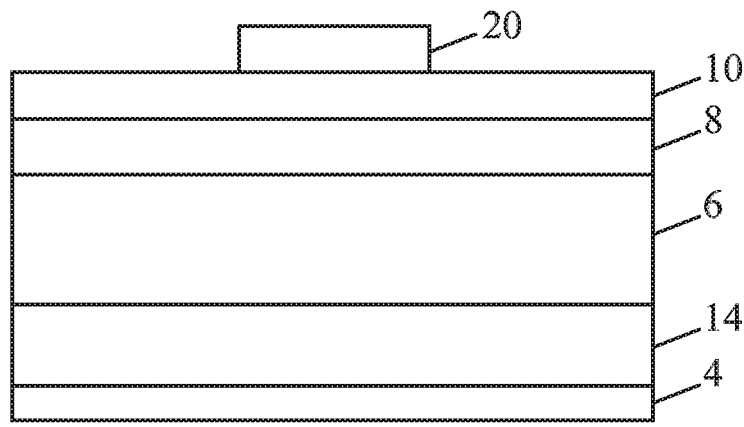

To obtain these regions, a protective or masking layer 20 is initially used as illustrated in FIG. 8 to define the first region 16 with precision. This mask 20 may be implemented for example with a photosensitive polymer enabling the definition of the first region 16 using conventional photolithography techniques. Such a definition process using a polymer is well known to those skilled in the art and will not be further described here.

Once the first region 16 is defined and the mask 20 is placed to protect the third buffer layer 10, an ion implantation process is performed on the entire surface of the third buffer layer 10 which is not protected by the mask 20. Preferably an N-type dopant such as Si is used.

Localized implantation, also called localized doping, of a GaN layer requires relatively high energy for the dopants. For the dopants to penetrate the GaN layer by several nm, energy on the order of tens or even hundreds of keV is required. Such energy is required because of a relatively high atomic density of the GaN compared for example to that of silicon. Methods for ion implantation are currently well known and controlled, and therefore will not be presented here.

To finalize the implantation process, annealing is performed so that the dopant species are positioned in substitutional sites (activation). Annealing is also used so that the GaN recrystallizes after the damage caused by implantation. For example, the annealing temperature is on the order of 1000° C.

Figure 9A:
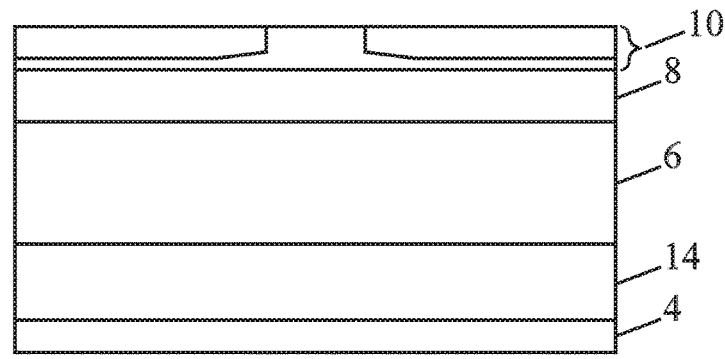

Advantageously, this implantation step is used to cancel the influence of the presence of the P-doped second buffer layer 8 on the two-dimensional electron gas in the two regions 18. In an exemplary embodiment, the N+ doping in the third buffer layer 10 is Gaussian in shape as schematically shown in FIG. 9a.

The dimensions of the first region 16 and the thickness of the third buffer layer 10 play an important role in the properties of the heterostructure. It is therefore preferable to define the implantation area precisely.

Note that the materials which can be used to create the masking layer 20 have been given above solely as an example, as has the method for doping the two regions 18. Furthermore, it is understood that all the various steps of the technological process, for example such as the photosensitive resin deposition phases, photolithography steps, and cleaning steps required for such a process, have not been cited to avoid complicating the description.

Figure 9B:
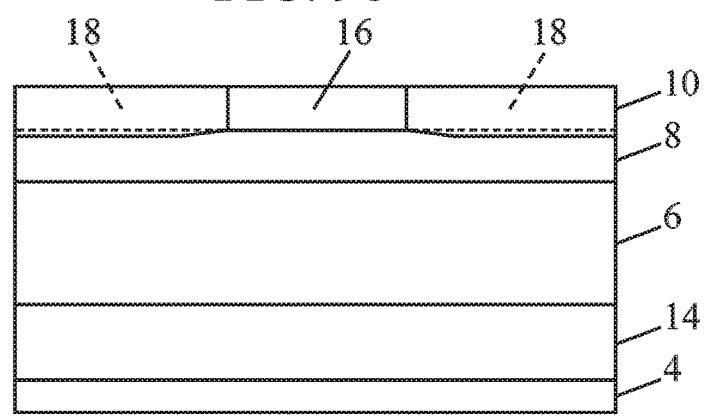

In a variant of the invention, the N+ doping in the third buffer layer 10 allows propagation of the latter into the P-doped area of the second buffer layer 8, as schematically illustrated in FIG. 9b. The second buffer layer 8 may thus have a doping profile that is not constant throughout its thickness.

Figure 10:
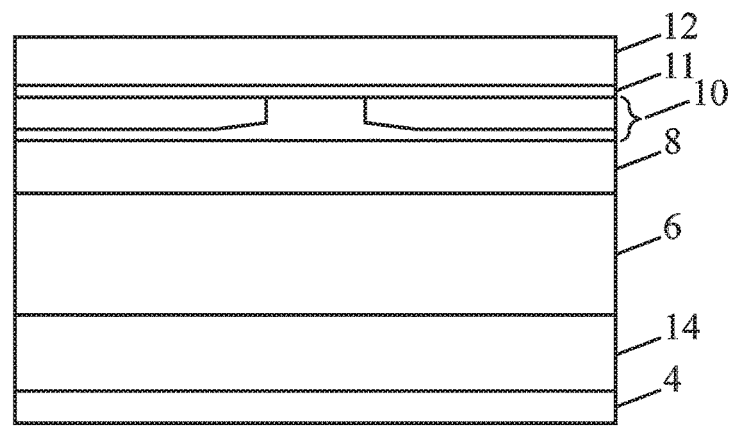

Referring to FIG. 10, an unintentionally doped intermediate layer 11 is then deposited on the third buffer layer 10. The material constituting the intermediate layer 11 can be formed of a semiconductor material with a wide bandgap Eg1 based on a column-III nitride identical to that of the stack of buffer layers. Preferably, the intermediate layer 11 is unintentionally doped UID-GaN. The process for obtaining this layer is identical to the process presented above for producing the first buffer layer 6. Furthermore, the intermediate layer 11 has a thickness between 10 and 30 nm, preferably about 10 nm, to shift the threshold voltage of the HEMT to positive values.

Referring to FIG. 10, a barrier layer 12 is then deposited on the unintentionally doped intermediate layer 11. The material constituting the barrier layer 12 may be formed of a semiconductor material having a wide bandgap Eg2. In the example considered here, this layer can be composed of AlGaN, such as AlGa(1−x)N, where x is the mole fraction and is between 0 and 1, with the thickness of the barrier layer 12 being below 1 μm.

In an embodiment not shown in the figures, the barrier layer 12 may be composed of several layers with respective controlled properties, for example a doped layer called the donor layer supplying electrons participating in the formation of the two-dimensional electron gas.

The heterojunction structure 2 presented above provides an improvement, for example, in controlling the threshold voltages of HEMT transistors in order to obtain "normally OFF" transistors. In addition, such a structure allows obtaining a transistor with improved reliability.

Figure 11:
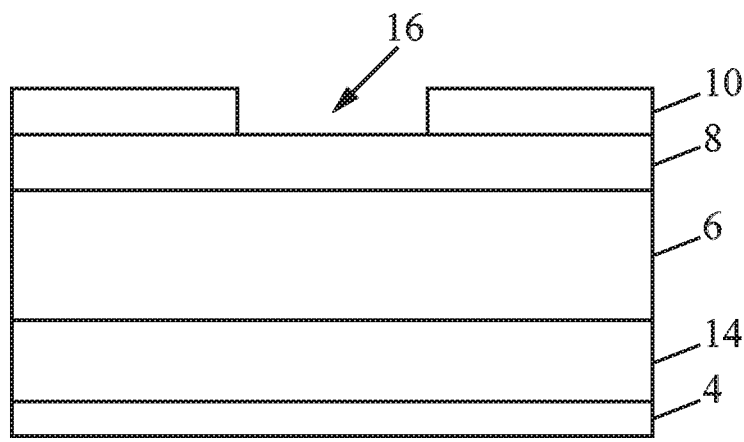

In an alternative embodiment, the third buffer layer 10 is doped with an N-type dopant during the growth process of said layer. The N-type dopant can be Si. To define the first region 16 (FIG. 11), the third buffer layer 10 is locally etched, preferably using a dry etchant for example.

Figure 12:
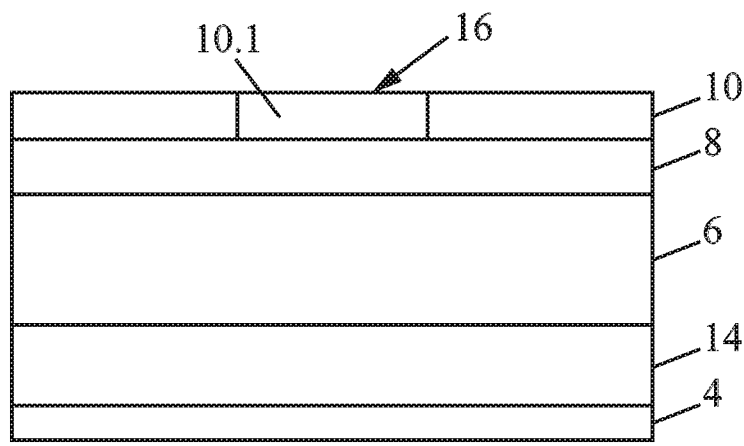

An unintentionally doped GaN layer 10.1 is then created in the first region 16 (FIG. 12). Thus, the presence of the P+ doped second layer 8, under portion 10.1 of the third buffer layer 10, will influence the gas 2DEG. Advantageously, this process can reduce charge defects within the volume of the third buffer layer 10.

Figure 13:
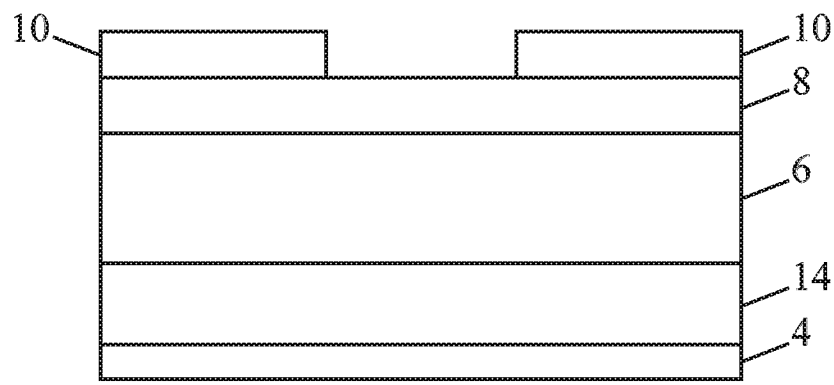
Figure 14:
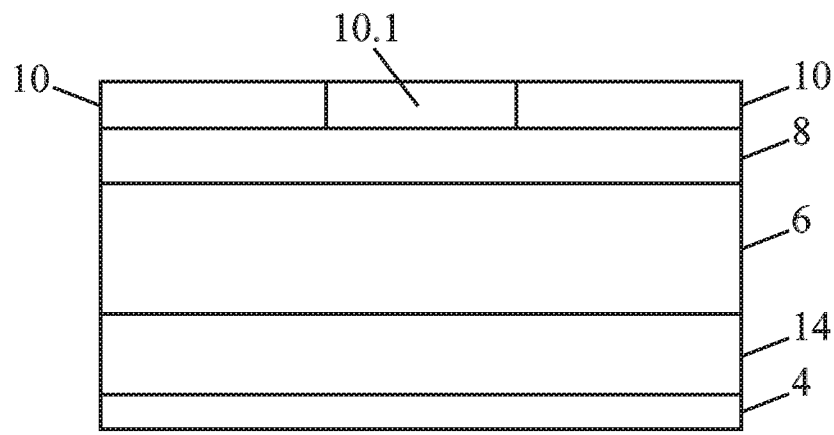

In another variant illustrated in FIG. 13, the N+ doped third buffer layer 10 is formed by a known deposition process called the "lift-off process" which defines the first region 16 without etching the third buffer layer 10. Then the layer of GaN-NID 10.1 is deposited (FIG. 14).

Advantageously, the first buffer layer 6, layer 11, and the first region 16 may have light N doping (1016 to 1017 cm-3) that is much less than the N+ doping (1019 to 1020 cm-3) of the region 18. The light N doping may advantageously be a bit below, at a density/concentration of between 1015 and 1016 cm-3.

Note that the term 'unintentionally doped' covers cases where there is light doping, such as the light N doping mentioned just above.

In an exemplary embodiment of an HEMT transistor, it comprises as represented in FIG. 15:
a planar substrate 4,
a stack of buffer layers with at least three layers of a same semiconductor material with a wide bandgap Eg1 based on a column-III nitride, including:
an unintentionally doped first buffer layer 6 arranged on the substrate 4,
a second buffer layer 8 arranged on the first layer 6 and having a predefined thickness in a direction orthogonal to the substrate plane,
an unintentionally doped third buffer layer 10 arranged on the second buffer layer 8 and having a predefined thickness in a direction orthogonal to the substrate plane,
an unintentionally doped intermediate layer 11 arranged on the third buffer layer 10, of a semiconductor material with a wide bandgap Eg1 based on a column-III nitride identical to that of the stack of buffer layers,
a barrier layer 12 arranged on the intermediate layer 11, said barrier layer 12 being of a semiconductor material with a wide bandgap Eg2 based on a column-III nitride,
source (S), drain (D), and gate (G) electrodes.

Note that the P+ doped second buffer layer 8 is not connected to any electrode of the transistor, neither the source nor the drain nor the gate, while the second layer preferably extends over the entire surface of the transistor. In other words, the P+ doped second buffer layer 8 is floating.

In addition, note that the gate electrode G is located just above the first region 16, with similar dimensions.

The manufacturing method in an exemplary embodiment of a transistor (HEMT) using such a heterostructure comprises:

preparing a planar substrate 4, successively depositing on the substrate 4 a stack of buffer layers made of a same semiconductor material based on a column-III nitride, including:

depositing a first buffer layer 6 on the substrate 4, said semiconductor material of which said first buffer layer is made being unintentionally doped, depositing a second buffer layer 8 on the first buffer layer 6, having a predefined thickness in a direction orthogonal to the substrate plane and the doping of said second buffer layer being done using P+ dopants throughout its entire thickness;

depositing a third buffer layer 10 on the second buffer layer 8, having a predefined thickness in a direction orthogonal to the substrate plane, said semiconductor material of which said third buffer layer is made being unintentionally doped, doping, using N+ dopants, at least one region 18 of the third buffer layer 10 adjacent to a first region 16 of said third buffer layer which is unintentionally doped throughout its entire thickness, depositing an unintentionally doped intermediate layer 11, of a semiconductor material with wide bandgap Eg1 based on column-III nitride identical to that of the stack of buffer layers, on the third buffer layer 10, depositing a barrier layer 12 of a semiconductor material with a wide bandgap based on a column-III nitride, on the intermediate layer 11, creating the gate (G), drain (D), and source (S) electrodes using one or more layers of electrically conductive material.

Note that all the intermediate steps involved in such a method, which are the steps of photolithography, cleaning, as well as the photosensitive resin deposition steps for example, are not described in detail here to avoid complicating the description.

The drain D and source S electrodes are said to be "ohmic" contacts, creating low resistance metal/semiconductor junctions, and the gate electrode G is a metal/semiconductor junction called "Schottky". As the manufacturing process for such electrodes is known to the skilled person, it will not be detailed in the description.

The metals used to implement these contact pads of the HEMT transistor described in the invention can be of different kinds, depending on the desired properties of the contacts.

The electrodes may be composed of a single metal layer, for example of Ti, Al, or other metals, or even a metal bilayer or trilayer.

These metals may be deposited by conventional metal deposition methods used in microelectronics, such as the Lift-off method or the LIGA method (Lithography, Electroplating, Molding). Alternatively, the electrodes may be composed of other materials whose electrical properties have been previously modified to be suitable for the desired contact resistance.

As has already been presented above, the invention provides an HEMT transistor with a zero or positive threshold voltage in order to obtain a "normally off" HEMT transistor. To do this, in an exemplary embodiment of the method, an unintentionally doped first region 16 is created which enables the P+ doped layer placed under the region to influence the electron gas 2DEG. The first region 16 is positioned under the gate electrode (G) of the transistor and, in some embodiments, is 10 nm thick and has a width of 1 μm. These parameters provide control of the threshold voltage of the HEMT transistor.

In order not to deplete the conduction channel in a region not controlled by the gate voltage, the first region 16 is characterized by its length Lo16 and its width La16 in a plane parallel to the substrate plane and is preferably of dimensions less than or equal to the dimensions of the gate electrode G in a plane parallel to the substrate plane.

Figure 16:
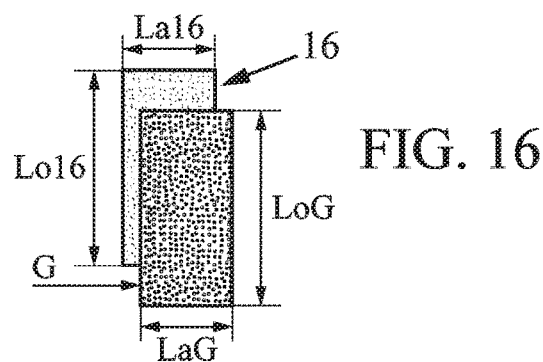
FIG. 16 is a top view and FIGS. 17 and 18 are side views showing the position of the gate electrode of the transistor with respect to a first unintentionally doped region of an underlying buffer layer.

Referring to FIG. 16, we then have the following relations:

$$Lo16 \leq LoG \quad (1)$$

$$La16 \leq LaG \quad (2)$$

where:
Lo16 is the length of the first region 16,
La16 is the width of the first region 16,
LoG is the length of the gate electrode (G), and
LaG is the width of the gate electrode (G).

These dimensions are in a plane parallel to the substrate plane.

Figure 17:
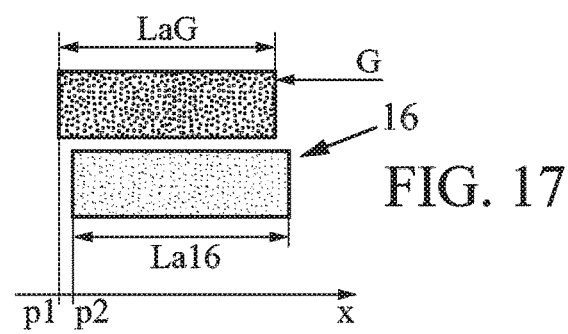
Figure 18:
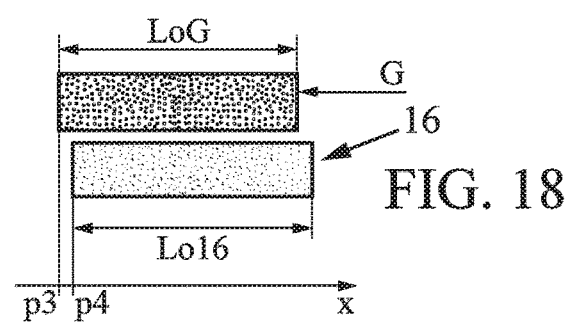

In addition, in order to avoid blocking the gate current, the placement of the first region 16 with respect to the gate electrode G is important. To do this, the placement of the first region 16 with respect to the gate electrode G must be (FIG. 17 and FIG. 18):

$$[B1=0; B2=0]_{LoZCP=LoG; LaZCP=LaG} \quad (3)$$

where:

$$[B1 \leq 0; B2 \leq 0]_{LoZCP<LoG; LaZCP<LaG} \quad (4)$$

With:

$$B1 = p1 - p2, \quad (5)$$

$$B2 = p3 - p4. \quad (6)$$

where:
p1 is the positioning of the gate electrode (G) on the x axis,
p2 is the positioning of the first region 16 on the x axis,
p3 is the positioning of the gate electrode (G) on the z axis,
p4 is the positioning of the first region 16 on the z axis,
B1 is the distance between the gate electrode (G) and the first region 16 along the x axis
B2 is the distance between the gate electrode (G) and the first region 16 along the z axis,
Lo16 is the length of the first region 16,
La16 is the width of the first region 16,
LoG is the length of the gate electrode (G), and
LaG is the width of the gate electrode (G).

The presence of the unintentionally doped first region 16 placed on the P+ doped second buffer layer 8 serves to increase the difference in the Fermi level, and therefore the conduction band of the AlGaN/GaN heterojunction.

According to another embodiment, the invention proposes controlling the threshold voltage of the transistor by varying the distance between the second buffer layer 8 (P+ doped) and the AlGaN/GaN interface between layer 11 and the barrier layer 12. In effect, increasing or decreasing the distance between the second buffer layer 8 and the barrier layer 12 allows adjusting the difference between the Fermi level and the conduction band and therefore adjusting the threshold voltage of the transistor.

Figure 19:
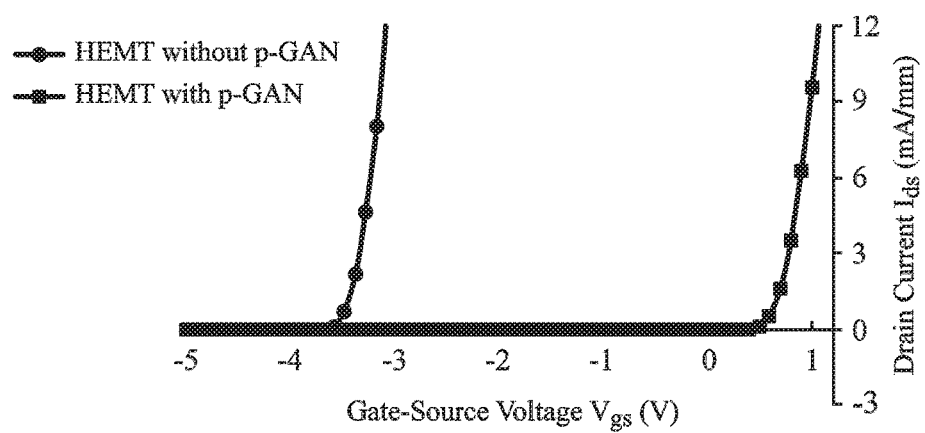
FIG. 19 is a graph showing the threshold voltage and the current of the transistor of FIG. 15 as a function of its gate-source voltage.

The graph of FIG. 19 compares the threshold voltage of a transistor according to an exemplary embodiment of the invention and the threshold voltage of a conventional "normally ON" HEMT having the same physical and geometric parameters with the exception of the first region 16. For this structure which is shown by way of example, the parameters of the structure are:

distance between the top of layer 8 and the interface between layer 11 and the barrier layer 12=10 nm, lateral opening (width)=1 μm, thickness of layer 8=500 nm.

These simulation results show that, unlike a conventional HEMT transistor, the threshold voltage of the HEMT transistor is positive due to the adjustment of the distance between the second buffer layer 8 and the interface between the intermediate layer 11 and the barrier layer 12. However, the leakage currents of such a structure remain relatively high because of the presence of a Schottky contact between the gate electrode G and the barrier layer 12.

To overcome these disadvantages, another exemplary embodiment integrates an oxide layer between the gate electrode G and the Al(1−x)GaN layer. This further comprises, as represented in FIG. 20:

a planar substrate 4, a stack of buffer layers with at least three layers of a same semiconductor material with a wide bandgap Eg1 based on a column-III nitride, including:

an unintentionally doped first buffer layer 6 arranged on the substrate 4, a second buffer layer 8 arranged on the first layer 6 and having a predefined thickness in a direction orthogonal to the substrate plane, an unintentionally doped third buffer layer 10 arranged on the second buffer layer 8 and having a predefined thickness in a direction orthogonal to the substrate plane, an unintentionally doped intermediate layer 11 arranged on the third buffer layer 10, of a semiconductor material with a wide bandgap Eg1 based on a column-III nitride identical to that of the stack of buffer layers, a barrier layer 12 arranged on the intermediate layer 11, said barrier layer 12 being of a semiconductor material with a wide bandgap Eg2 based on a column-III nitride, source S and drain D electrodes arranged on the barrier layer 12, an electrically insulating thermal oxide layer 24, and a gate electrode G arranged on the electrically insulating layer 24.

The skilled person will recognize that the techniques which can be used for depositing the insulating layer have been described above.

The presence of the electrically insulating layer 24 thus provides a MOS contact (metal/oxide/semiconductor) between the gate contact G and the barrier layer 12.

The oxide layer 24 can be obtained by thermal oxidation, for example using a PECVD (Plasma Enhanced Chemical Vapor Deposition) oxidation furnace to obtain layers of several nanometers to a micrometer in thickness, for example.

The presence of the oxide layer and the elimination of the Schottky contact serve to reduce the leakage current by a factor of about 20 for example, thereby greatly improving the performance of the HEMT transistor.

The threshold voltage obtained as a function of the parameters cited above allows obtaining an HEMT transistor with a threshold voltage of 4V for example. This positive threshold voltage thus provides an HEMT transistor according to the various embodiments presented which satisfies the "normally OFF" functionality. New fields of application are possible with such a component. Indeed, this high threshold voltage makes this type of component insensitive to external interference such as noise in the gate voltage, particularly electromagnetic noise.

The above description has been given for illustrative purposes only and does not limit the scope of the invention. Any technically feasible embodiment may be preferred to the embodiments described. For example, the GaN material used in the description may be replaced by GaAs. The use of such a material therefore implies that the type of dopant and the doses to be used, as well as the dimensions and positioning of layer 8, will be chosen so that the overall behavior of an HEMT transistor using a GaAs material corresponds to the transistor described herein.

Similarly, the steps of the technological process described herein are given by way of illustration and are not limited to the examples given here.

Finally, it is understood that the various improvements described can be used separately or in combination, depending on the quality and performance desired for the HEMT transistor implemented with this structure.

The invention is not limited to the embodiments presented. Other variants and embodiments can be derived and implemented by the skilled person upon reading this description and the accompanying figures. The reference signs are not to be construed as limiting the scope of the invention or the scope of the description.

In the above description, it is assumed that when an element, for example such as a layer, region, or substrate, is referred to as being "on" or "over" another element, said element may be directly on the other element or intermediate elements may be present.

It is also assumed that the terms first, second, third, etc. may be used herein to describe various elements, components, regions, layers, and/or sections. These elements, regions, layers, and/or sections are not to be limited by these terms. These terms are only used to distinguish one element, component, region, layer, or section from another region, layer, or section. Thus, a first element, region, layer, or section described above could be called a second element, region, layer, or section without departing from the teachings of the inventive concepts.

Moreover, relative positioning terms such as "under", "below", "lower", "above", "upper", etc., have been used herein for ease of description and to describe the positioning of one element relative to another element as illustrated in the figures.

It is understood that the terms of relative positioning are intended to cover different orientations of the device of the invention during use or operation in addition to the orientation depicted in the figures. For example, if the device of the invention is turned over, elements described as being "below" or "under" other elements would then be oriented "above" the other elements. Thus, the term "below" can encompass both an "above" orientation and a "below" orientation. The device can also be oriented otherwise (rotated 90 degrees or other orientations) and the terms of relative positioning used herein shall be interpreted accordingly.

What is claimed is:

1. A heterojunction structure, in particular for a high electron mobility transistor (HEMT), comprising:

a planar substrate, a stack of buffer layers with at least three layers of a same semiconductor material with a wide bandgap Eg1 based on a column-III nitride, including:

an unintentionally doped first buffer layer arranged on the substrate, a second buffer layer arranged on the first layer and having a predefined thickness in a direction orthogonal to the substrate plane,
a third buffer layer arranged on the second buffer layer and having a predefined thickness in a direction orthogonal to the substrate plane,
an unintentionally doped intermediate layer arranged on the third buffer layer, of a semiconductor material with a wide bandgap Eg1 based on a column-III nitride identical to that of the stack of buffer layers,
a barrier layer arranged on the intermediate layer, said barrier layer being of a semiconductor material with a wide bandgap Eg2 based on a column-III nitride,
wherein:
the second buffer layer has substantially constant P+ doping throughout some or all of its thickness, and
the third buffer layer comprises a first region which is unintentionally doped throughout its entire thickness and at least one second region adjacent to said first region and which is doped with N+ doping.

2. The heterojunction structure according to claim 1, wherein the second region adjacent to the first region of the third buffer layer has constant doping throughout the entire thickness of said third buffer layer.

3. The heterojunction structure according to claim 1, wherein the second region adjacent to the first region of the third buffer layer has Gaussian-shaped doping along the thickness of said third buffer layer.

4. The heterojunction structure according to claim 1, wherein a distance in a direction orthogonal to the substrate plane, between the second buffer layer and the interface between the intermediate layer and the barrier layer, is less than 20 nm.

5. The heterojunction structure according to claim 1, wherein the semiconductor material based on a column-III nitride of which are made the first buffer layer, the second buffer layer, the third buffer layer, the intermediate layer, and the barrier layer, comprises GaN.

6. The heterojunction structure according to claim 1, wherein the N+ dopant is silicon.

7. The heterojunction structure according to claim 1, comprising at least one transition layer interposed between the substrate and the first buffer layer.

8. A high electron mobility transistor comprising a heterojunction structure according to claim 1, and comprising a gate electrode of a predefined surface area in a first plane parallel to the substrate plane, and a drain electrode and source electrode both arranged in a second plane above the barrier layer of the heterojunction structure.

9. The transistor according to claim 8, wherein the first region of the third buffer layer of the heterojunction structure is arranged under the gate electrode, and has a surface area in a plane parallel to the substrate plane which is less than or equal to said surface area of the gate electrode.

10. The transistor according to claim 8, further comprising an oxide-based insulating layer, on the barrier layer, below the gate electrode, the first and second planes being coincident or offset.

11. The transistor according to claim 10, wherein the insulating layer has a surface area in a plane parallel to the substrate plane identical to the surface area of the gate electrode.

12. The transistor according to claim 8, wherein the P+ doped second buffer layer is not directly connected to one of the electrodes of the transistor.

13. An electronic device with semiconductor, comprising at least one high electron mobility transistor according to 8.

14. A method for manufacturing a heterojunction structure of semiconductor material, in particular for a high electron mobility transistor, comprising:
preparing a planar substrate,
successively depositing on the substrate a stack of buffer layers made of a same semiconductor material with a wide bandgap Eg1 based on a column-III nitride, including:
depositing a first buffer layer on the substrate, said semiconductor material of which said first buffer layer is made being unintentionally doped,
depositing a second buffer layer on the first buffer layer, having a predefined thickness in a direction orthogonal to the substrate plane, and the doping of said second buffer layer being done with P+ dopants throughout its entire thickness;
depositing a third buffer layer on the second buffer layer having a predefined thickness in a direction orthogonal to the substrate plane, said semiconductor material of which said third buffer layer is made being unintentionally doped,
doping, using N+ dopants, at least one region of the third buffer layer adjacent to a first region of said third buffer layer which is unintentionally doped throughout its entire thickness,
depositing an unintentionally doped intermediate layer, of a semiconductor material with a wide bandgap Eg1 based on a column-III nitride identical to that of the stack of buffer layers, on the third buffer layer,
depositing a barrier layer of a semiconductor material with a wide bandgap based on a column-III nitride, on the intermediate layer.

15. A method for manufacturing a heterojunction structure according to claim 14, wherein the successive deposition of the stack of buffer layers is achieved by an epitaxy process without interruption.

* * * * *